(12) United States Patent
Rajski et al.

(10) Patent No.: US 10,444,282 B2
(45) Date of Patent: Oct. 15, 2019

(54) TEST POINT INSERTION FOR LOW TEST PATTERN COUNTS

(71) Applicant: Mentor Graphics Corporation, Wilsonville, OR (US)

(72) Inventors: Janusz Rajski, West Linn, OR (US); Elham K. Moghaddam, Beaverton, OR (US); Nilanjan Mukherjee, Wilsonville, OR (US); Jerzy Tyszer, Poznan (PL); Justyna Zawada, Paczkowo (PL)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/884,611

(22) Filed: Oct. 15, 2015

(65) Prior Publication Data

US 2016/0109517 A1 Apr. 21, 2016

Related U.S. Application Data

(60) Provisional application No. 62/064,900, filed on Oct. 16, 2014.

(51) Int. Cl.
*G06F 17/50* (2006.01)
*G01R 31/3183* (2006.01)

(52) U.S. Cl.
CPC ........ *G01R 31/318307* (2013.01); *G01R 31/318371* (2013.01); *G01R 31/318342* (2013.01)

(58) Field of Classification Search
CPC ............ G06F 17/5045; G06F 17/5022; G06F 2217/66; G06F 2217/78; G06F 11/00; G06F 11/0757; G06F 11/1008; G06F 11/141; G06F 11/1629; G06F 11/1633; G06F 11/1641; G06F 11/1645; G06F 11/165; G06F 11/01; G06F 13/28; G06F 12/0207; G06F 12/04; G06F 12/0607; G06F 13/16; G06F 13/1673; G06F 13/1689; G06F 9/3867; G06F 9/4494; G06F 11/2242; G06F 11/3664; G06F 11/3688; G06F 17/50; G06F 17/5054; G06F 9/45504; G06F 21/73; G06F 11/267; G06F 11/2733; G06F 1/163;
(Continued)

(56) References Cited

U.S. PATENT DOCUMENTS 7,296,249 B2 * 11/2007 Rinderknecht ............................ G01R 31/318547 714/25
2002/0116690 A1 * 8/2002 Lackey .......... G01R 31/318536 716/113

(Continued)

OTHER PUBLICATIONS

Isao et al. "Accelerated Test Points Selection Method for Scan-Based BIST" 1997, IEEE, pp. 359-364 (Year: 1997).*

(Continued)

*Primary Examiner* — Binh C Tat (57) ABSTRACT

Various aspects of the disclosed technology relate to conflict-reducing test point insertion techniques. Locations in a circuit design for inserting test points are determined based on internal signal conflicts caused by detecting multiple faults with a single test pattern. Test points are then inserted at the locations. The internal signal conflicts may comprise horizontal conflicts, vertical conflicts, or both. The test points may comprise control points, observation points, or both.

24 Claims, 9 Drawing Sheets

(58) Field of Classification Search
CPC .......... G06F 3/00; G06F 3/017; G06F 21/554;
G06F 21/566; G06F 21/567; G06F
2221/033; H04L 43/50; H04L 25/08;
G01N 21/6428; B01L 2300/0825; H04B
3/46
USPC .................................. 716/100–106, 136–139
See application file for complete search history.

(56) References Cited

U.S. PATENT DOCUMENTS

| | | | |
|---|---|---|---|
| 2004/0098686 A1* | 5/2004 | Lackey .......... | G01R 31/318536 716/102 |
| 2010/0017760 A1* | 1/2010 | Kapur ............ | G01B 31/318583 716/132 |
| 2014/0101627 A1* | 4/2014 | Mochizuki ............ | G06F 17/505 716/106 |

OTHER PUBLICATIONS

Briers, A. J. and Totton, K. A. E., "Random Pattern Testability by Fault Simulation", Proceedings of the IEEE International Test Conference, ITC'86. 274-281, 1986.

Iyengar, V. S. and Brand, D., "Synthesis of Pseudorandom Pattern Testable Designs", Proceedings of the IEEE International Test Conference, ITC'89. 501-508, 1989.

Tamarapalli, N. and Rajski, J., "Constructive Multiphase Test Point Insertion for Scan-Based BIST", Proceedings of the IEEE International Test Conference, ITC'96. 649-658, 1996.

Cheng, K.-T., and Lin, C.-J., "Timing-Driven Test Point Insertion for Full-Scan and Partial-Scan BIST", Proceedings of the IEEE International Test Conference, ITC'95, 506-514, 1995.

Nakao, M., Hatayama, K., and Highasi, I., "Accelerated test points selection method for scan-based BIST", Proceedings of the IEEE Asian Test Symposium, ATS'97, 359-364, 1997.

Chang, S.-C., Chang, S.-S., Jone, W.-B., and Tsai, C.-C. 1998. A novel combinational testability analysis by considering signal correlation. In Proceedings of the IEEE International Test Conference. ITC'98. 658-667.

Geuzebroek, M. J., van der Linden, J. T., and van de Goor, A. J. 2002. Test point insertion that facilitates ATPG in reducing test time and data volume. In Proceedings of the IEEE International Test Conference. ITC'02. 138-147.

Goldstein, L. H., and Thigpen, E. L. 1980. SCOAP: Sandia controllability/observability analysis program. In Proceedings of the IEEE Design Automation Conference. DAC'80. 190-196.

Seiss, B. H., Trouborst, P., and Schulz, M. 1991. Test point insertion for scan-based BIST. In Proceedings of the European Test Conference. ETC'91. 253-262.

Kumar, A., Rajski, J., Reddy, S.M., and Rinderknecht, T., "On the generation of compact deterministic test sets for BIST ready designs", Proceedings of the IEEE Asian Test Symposium, ATS'13, 201-206, 2013.

* cited by examiner

Flow chart 300

Flow chart 800

TEST POINT INSERTION FOR LOW TEST PATTERN COUNTS

RELATED APPLICATIONS

This application claims the benefit of U.S. Provisional Patent Application No. 62/064,900, filed on Oct. 16, 2014, and naming Janusz Rajski et al. as inventors, which application is incorporated entirely herein by reference.

FIELD OF THE DISCLOSED TECHNIQUES

The presently disclosed techniques relates to the field of circuit testing technology. Various implementations of the disclosed techniques may be particularly useful for reducing test data by inserting test points.

BACKGROUND OF THE DISCLOSED TECHNIQUES

Contemporary electronic design automation (EDA) tools in general and automatic test pattern generation (ATPG) in particular are capable of producing tests that offer high coverage of failures occurring in large and complex semiconductor digital designs. Notwithstanding the success of test compression, ATPG-produced test sets continue to grow at alarming rates. This is mainly caused by: 1) designs feature a large number of clock domains with staggeringly complex clocking schemes; 2) a typical test generation process for at-speed patterns includes a large number of steps, with all of them handling several clock sequences; 3) the ratios of gates and flip-flops are large and still increasing, but the number of I/O pins does not follow the continuing growth in the number of gates and flip-flops inside a chip; 4) tested circuits comprise logic of large combinational depths; 5) automatically generated register-transfer level (RTL) designs feature complex control logic circuits; and 6) a typical test set contains many long tail test patterns—although these patterns contain very few specified bits, their mutual conflicts effectively prevent compression-aware merging of test cubes.

Moreover, the gate level abstraction and traditional fault models (stuck-at, transition) are no longer sufficient to ensure high quality and low-DPM (defects per million) metrics for state-of-the-art digital circuits. As a result, the next generation tools are expected to target novel timing-related and actual-layout-related fault models and patterns, such as n-detect, embedded-multi-detect, or recently proposed cell-aware. Unfortunately, this trend leads to inflated test sets that require more storage than many external testers can provide. The test application time is an even more evident efficiency limiting and cost-increasing factor, which has become an unprecedented challenge in the testing of embedded systems, automotive electronics, or system-on-chip designs, to name just a few.

The disclosed technology relates to inserting conflict-reducing test points which can reduce test pattern counts. Traditionally, test point insertion techniques attempt to improve the fault detection likelihood while minimizing a necessary hardware real estate. They select internal lines in a circuit to subsequently add control points or observation points in order to activate (excite) faults or observe them, respectively. Identification of potential test point candidates is a complex problem because of several interacting factors. In general, optimal test point insertion for circuits with reconvergent fan-outs is an NP-complete problem and, hence, numerous empirical guidelines and approximate techniques have been proposed to identify suitable test points (control points and observation points) locations and improve the overall circuit testability.

Depending on how a test point is driven or observed, its insertion may require a few extra gates and wires routed to or from additional flip-flops to be included in scan chains. As it introduces area and performance penalty, the number of test points is usually limited. Furthermore, the identification of test points must be computationally inexpensive despite the structural complexity of large designs.

The first systematic TPI method was introduced in Briers, A. J. and Totton, K. A. E., "Random Pattern Testability By Fault Simulation", Proceedings of the IEEE International Test Conference, ITC'86. 274-281, 1986, which is incorporated herein by reference. Simulations are used first to obtain profiles of fault propagation and correlations between internal signals. Test points are then inserted to break signal correlations.

Similarly, the technology disclosed in Iyengar, V. S. and Brand, D., "Synthesis Of Pseudorandom Pattern Testable Designs", Proceedings of the IEEE International Test Conference, ITC'89. 501-508, 1989, which is incorporated herein by reference, employs fault simulation to identify gates that block fault propagation and inserts test points to regain successful propagation of fault effects.

A divide-and-conquer approach disclosed in Tamarapalli, N. and Rajski, J., "Constructive Multiphase Test Point Insertion For Scan-Based BIST", Proceedings of the IEEE International Test Conference, ITC'96. 649-658, 1996, which is incorporated herein by reference, partitions the entire test into multiple phases. Within each phase, a group of test points is activated to maximize the fault coverage calculated over the set of still-undetected faults. A probabilistic fault simulation, which computes the impact of a new control point in the presence of the control points already selected, is used as a vehicle to select test points.

To avoid time-consuming simulations, other methods utilize the controllability and observability measures to identify the hard-to-control and hard-to-observe sectors of a circuit, at which test points are subsequently inserted. In particular, the schemes disclosed in Cheng, K.-T., and Lin, C.-J., "Timing-Driven Test Point Insertion For Full-Scan And Partial-Scan BIST", Proceedings of the IEEE International Test Conference, ITC'95, 506-514, 1995 and Nakao, M., Hatayama, K., and Highasi, I., "Accelerated test points selection method for scan-based BIST", Proceedings of the IEEE Asian Test Symposium, ATS'97, 359-364, 1997, which are incorporated herein by reference, use COP (Controllability Observability Program) estimates to extract testability data. Hybrid testability measures based on the SCOAP (Sandia Controllability/Observability Analysis Program) metrics, cost functions, a gradient-based method, or signal correlation are used as well to determine the best TP sites.

These conventional test point insertion techniques can improve the fault detection likelihood, but may not affect test pattern counts at all. As reported in Kumar, A., Rajski, J., Reddy, S. M., and Rinderknecht, T., "On the generation of compact deterministic test sets for BIST ready designs", Proceedings of the IEEE Asian Test Symposium, ATS'13, 201-206, 2013, which is incorporated herein by reference, the reduction of these counts can average anywhere between 0 and 35%. Therefore, it is desirable to develop new test point insertion techniques that can reduce the volume of test data.

BRIEF SUMMARY OF THE DISCLOSED TECHNIQUES

Various aspects of the disclosed technology relate to conflict-reducing test point insertion techniques. In one aspect, there is a method, executed by at least one processor of a computer, comprising: determining locations in a circuit design for inserting test points based on internal signal conflicts caused by detecting multiple faults with a single test pattern; inserting test points at the locations.

In another aspect, there is a method, executed by at least one processor of a computer, comprising: computing internal signal conflict metrics; adding/adjusting test points to/at locations selected based on internal signal conflict metrics; and repeating the computing and the adding/adjusting until one of one or more predetermined conditions is met.

In still another aspect, there are one or more non-transitory computer-readable media storing computer-executable instructions for causing one or more processors to perform a method, wherein the method comprises: determining locations in a circuit design for inserting test points based on internal signal conflicts caused by detecting multiple faults with a single test pattern; inserting test points at the locations.

In still another aspect, there are one or more non-transitory computer-readable media storing computer-executable instructions for causing one or more processors to perform a method, wherein the method comprises: adding/adjusting test points to/at locations selected based on internal signal conflict metrics; and repeating the computing and the adding/adjusting until one of one or more predetermined conditions is met.

In the above aspects, the test points may be control points. The internal signal conflicts may comprise horizontal conflicts. The horizontal conflict of a branch of a net in the circuit design may be measured based on numbers of faults being blocked by setting the branch to a signal of "0" and of "1", respectively. Additionally or alternatively, the internal signal conflicts may comprise vertical conflicts. The vertical conflict of a stem of a net may be measured based on numbers of conflicts due to fault propagation conditions and logic values being forward-implied by the conditions.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

General Considerations

Various aspects of the disclosed technology relate to conflict-reducing test point insertion techniques. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine" and "insert" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

Figure 1:
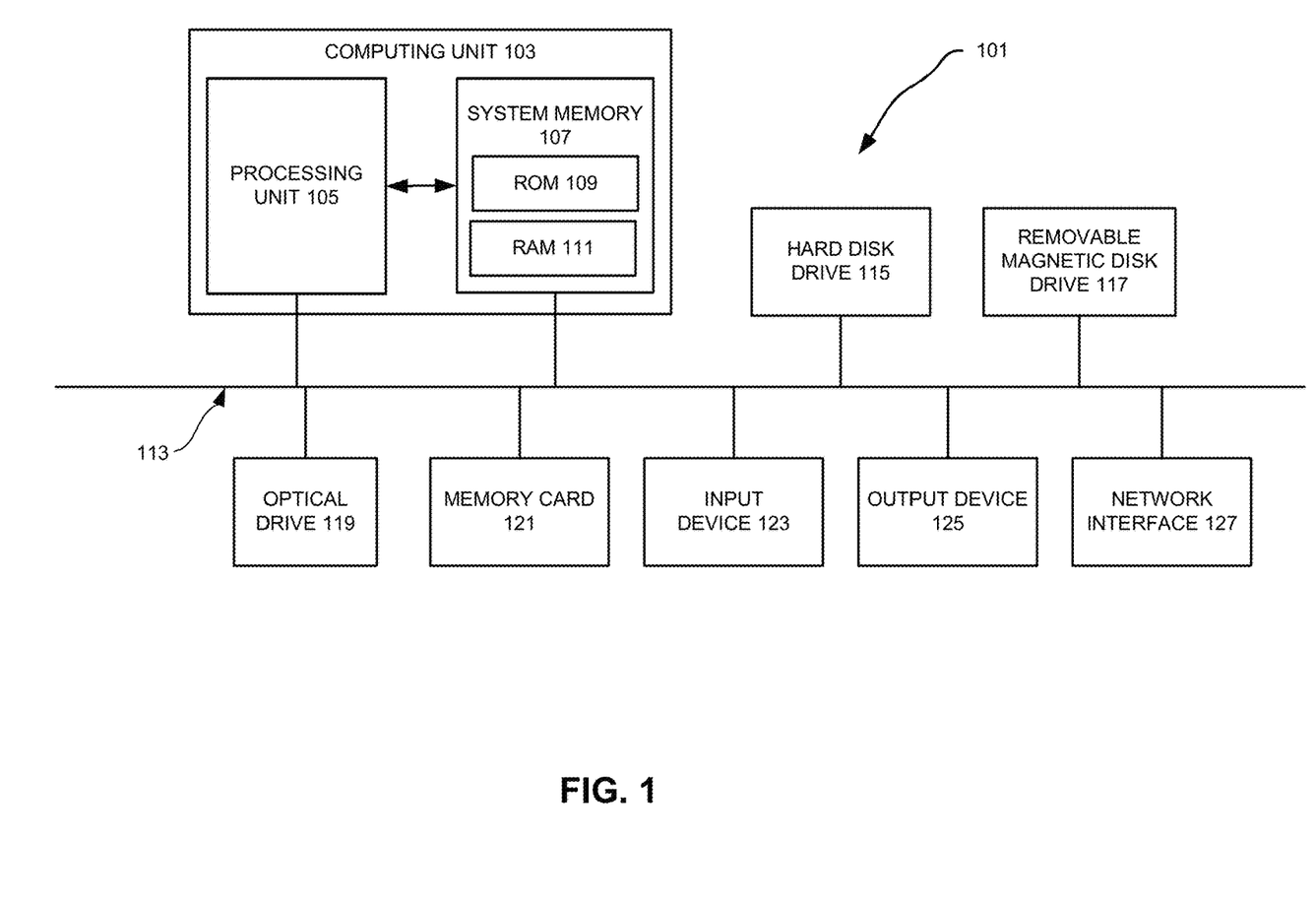
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Test Point Insertion Tools And Methods

Figure 2:
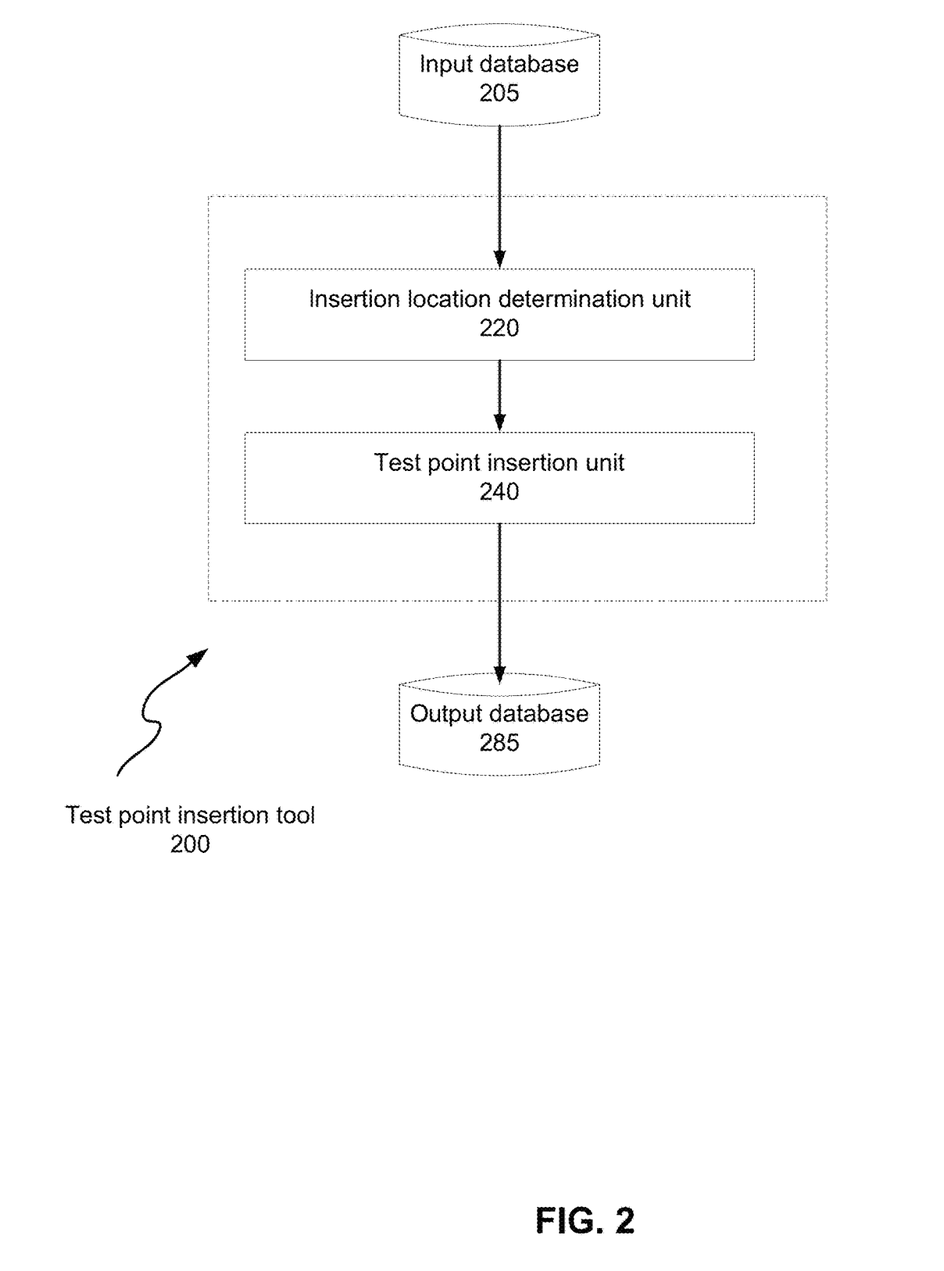
FIG. 2 illustrates an example of a test point insertion tool according to various embodiments of the disclosed technology.

FIG. 2 illustrates an example of a test point insertion tool according to various embodiments of the disclosed technology. As seen in the figure, the test point insertion tool 200 includes two units: an insertion location determination unit 220 and a test point insertion unit 240. Some implementations of the diagnosis tool 200 may cooperate with (or incorporate) one or both of an input database 205 and an output database 285.

As will be discussed in more detail below, the insertion location determination unit 220 determines locations in a circuit design for inserting test points based on internal signal conflicts. The test point insertion unit 240 then inserts test points at the determined locations.

As previously noted, various examples of the disclosed technology may be implemented by a computing system, such as the computing system illustrated in FIG. 1. Accordingly, one or both of the insertion location determination unit 220 and the test point insertion unit 240 may be implemented by executing programming instructions on one or more processors in a computing system such as the computing system illustrated in FIG. 1. Correspondingly, some other embodiments of the disclosed technology may be implemented by software instructions, stored on a non-transitory computer-readable medium, for instructing one or more programmable computers/computer systems to perform the functions of one or both of the insertion location determination unit 220 and the test point insertion unit 240. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

It also should be appreciated that, while the insertion location determination unit 220 and the test point insertion unit 240 are shown as separate units in FIG. 2, a single computer (or a single processor within a master computer) may be used to implement both of these units at different times, or components of these units at different times.

With various examples of the disclosed technology, the input database 205 and the output database 285 may be implemented using any suitable computer readable storage device. That is, either of the input database 205 and the output database 285 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, punched media, holographic storage devices, or any other non-transitory storage medium that can be used to store desired information. While the input database 205 and the output database 285 are shown as separate units in FIG. 2, a single data storage medium may be used to implement some or all of these databases.

Figure 3:
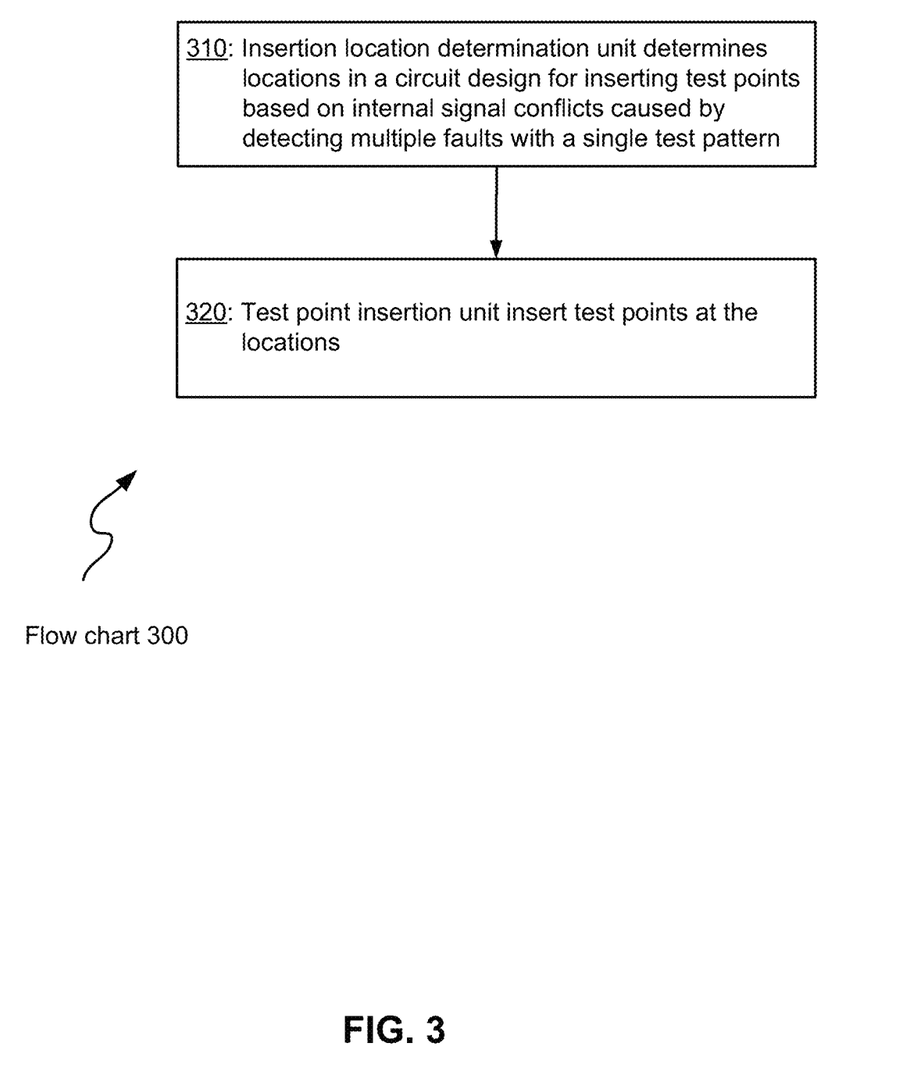
FIG. 3 illustrates a flowchart 300 showing a process of test point insertion that may be implemented according to various examples of the disclosed technology.
Figure 8:
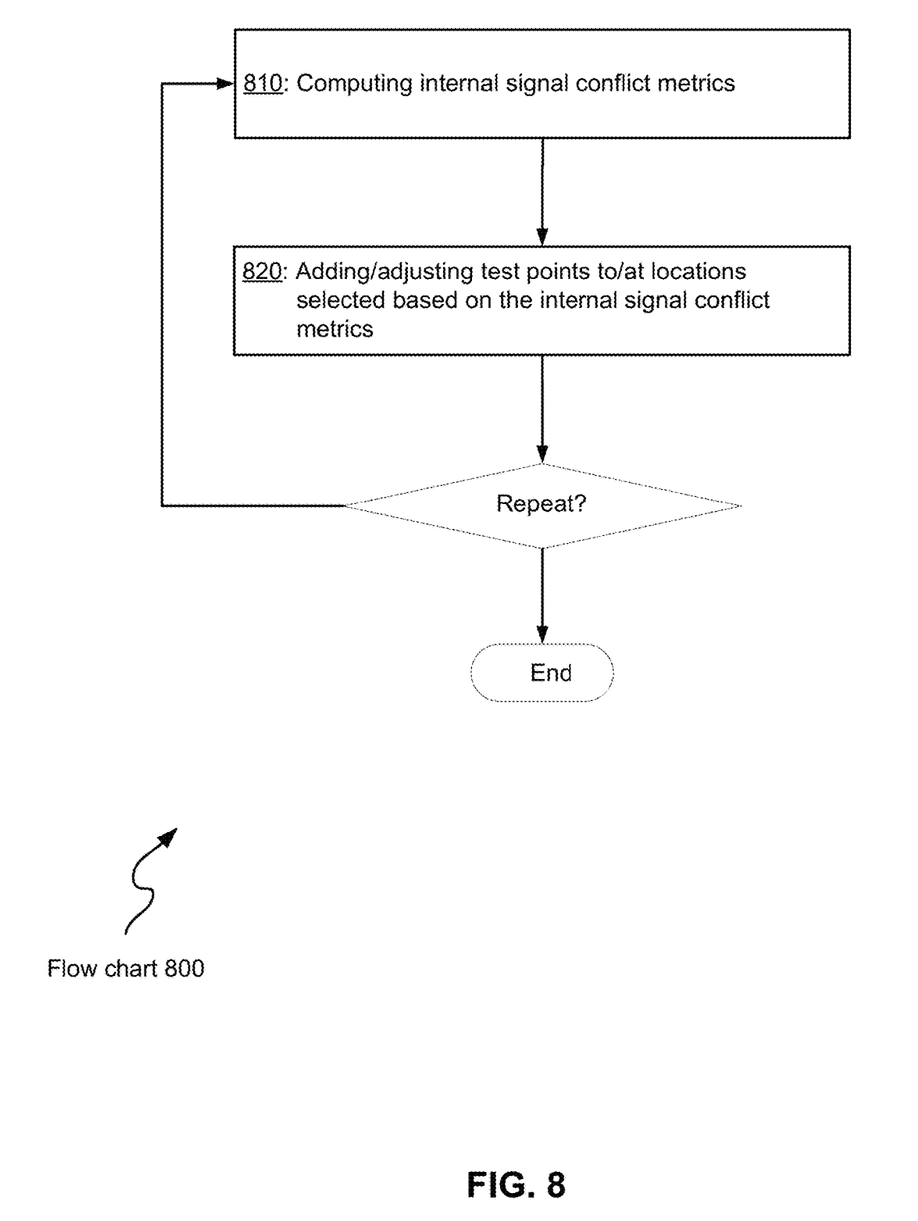
FIG. 8 illustrates another flowchart showing a process of test point insertion that may be implemented according to various examples of the disclosed technology.

FIG. 3 illustrates a flowchart 300 showing a process of test point insertion that may be implemented according to various examples of the disclosed technology. FIG. 8 illustrates another flowchart 800 showing a process of test point insertion that may be implemented according to various examples of the disclosed technology. For ease of understanding, methods of test point insertion that may be employed according to various embodiments of the disclosed technology will be described with reference to the test point insertion tool 200 illustrated in FIG. 2 and the flow charts 300 and 800 in FIGS. 3 and 8, respectively. It should be appreciated, however, that alternate implementations of a test point insertion tool may be used to perform the methods of test point insertion in the flow chart 300/800 according to various embodiments of the disclosed technology. In addition, it should be appreciated that implementations of the test point insertion tool 200 may be employed to implement methods of test point insertion according to different embodiments of the disclosed technology other than the ones illustrated by the flow charts 300 and 800.

In operation 310 of the flow chart 300, the insertion location determination unit 220 determines locations in a circuit design for inserting test points based on internal signal conflicts caused by detecting multiple faults with a single test pattern. In operation 320, the test point insertion unit 240 inserts test points at the determined locations.

An internal signal conflict arises out of incompatible decisions made on internal lines due to fault excitation, backward justifications, or fault propagation of multiple faults. Due to the internal signal conflict, these faults cannot be detected by the same test pattern.

Figure 4:
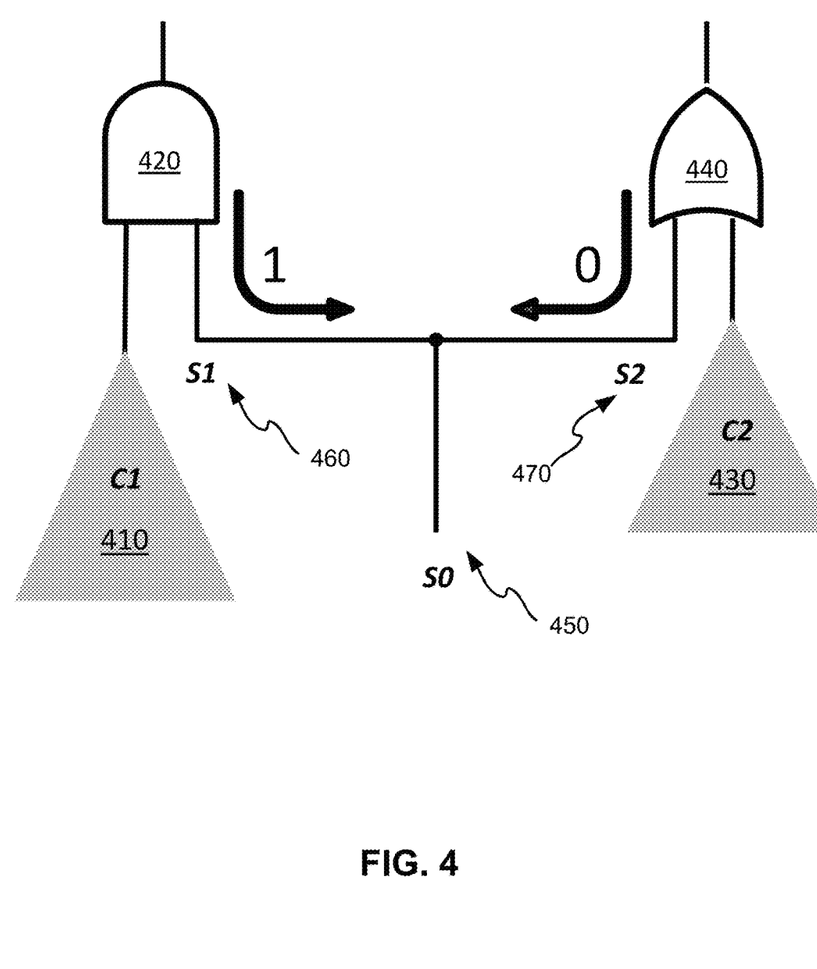
FIG. 4 illustrates an example of internal signal conflicts.

FIG. 4 illustrates an example of an internal signal conflict. To propagate faults from the cone of logic 410 through an AND gate 420, input $s_1$ (460) of the AND gate 420 must be set to 1. On the other hand, to propagate faults populating cone 430, input $s_2$ (470) of an OR gate 440 must assume the value of 0. Clearly, a conflict occurs at stem $s_0$ (450) because of mutually opposed fault propagation requirements that correspond to different non-controlling values for gates driven by a common stem. As a result, these particular faults (referred to as faults $C_1$ (410) and $C_2$ (430)) cannot be detected by the same test pattern.

It is worth noting that simultaneous detection of faults $C_1$ and $C_2$ would be possible provided a control point is placed on one of the stem branches. For example, one can insert a 1-injection circuit such as an OR gate on branch $s_1$ (460), allowing 1-controllability of this line (an OR control point). Alternatively, a 0-injection circuit such as an AND gate can be placed on branch $s_2$ (470), allowing 0-controllability of this particular net (an AND control point).

The internal signal conflicts may manifest themselves in a variety of ways. In some embodiments of the disclosed technology, the internal signal conflicts comprise horizontal conflicts. Before defining the horizontal conflicts, several related concepts employed to assess a fault-blocking mechanism will be explained first.

Figure 5:
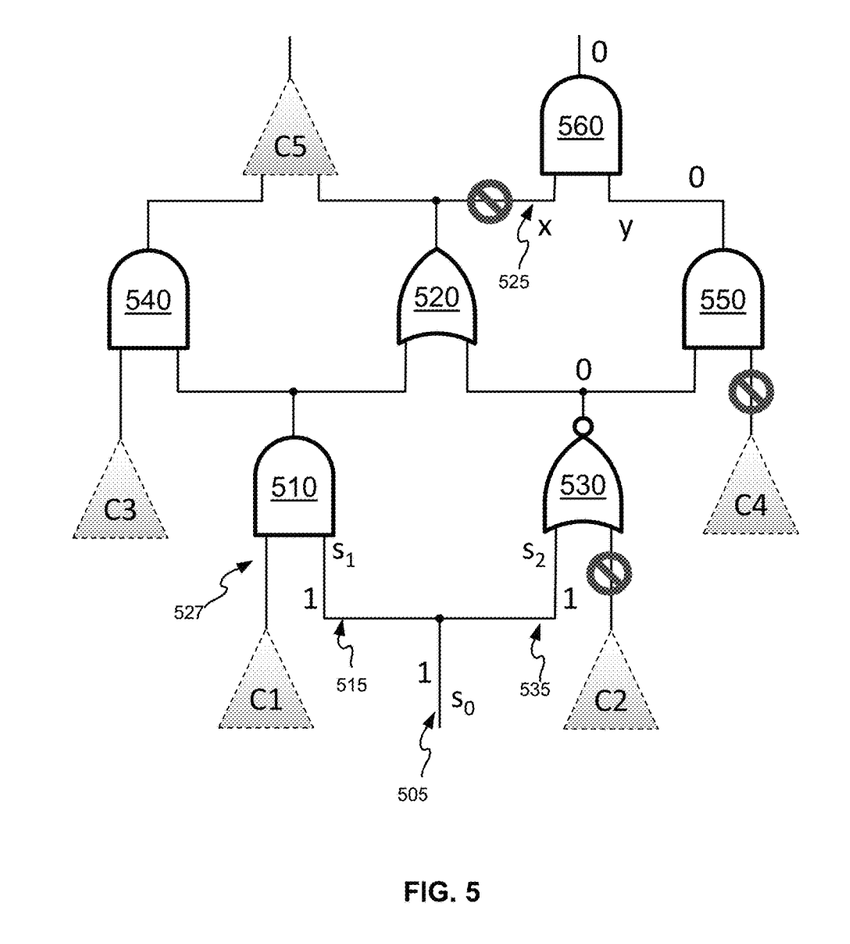
FIG. 5 illustrates an example of a circuit for explaining fault blocking mechanisms.

The number of faults whose propagation is blocked (for brevity—blocked faults) is determined based on the results of forward value propagation. Having set a given internal line to a logic value v, this value propagates subsequently forward as long as the outputs of gates visited along propagation paths can be uniquely determined. In particular, it applies to scenarios where v remains a controlling value for a visited gate G, or all inputs of G assume a non-controlling value. In FIG. 5, for example, if one sets stem $s_0$ (505) to 1, then it causes the output of gates 530, 550 and 560 to assume the value of 0. On the other hand, assigning the value of 0 to $s_0$ sets the output of gates 510 and 540 to 0, as it is a controlling value for the AND gates. Since gates 510 and 540 drive cone C5, further signal propagation depends on its internal structure.

Every AND, NAND, OR, and NOR gate is said to block faults if the controlling value reaches its input(s). For instance, faults C2 and C4 are blocked due to 1 at input $s_2$ (535). Also, faults affecting input 525 of gate 560 will be blocked, as their only propagation path leads to the output of gate 560. Finally, 0 at input $s_1$ (535) of gate 510 blocks its second input 527 and, thus, any fault observed on the output of C1 cannot move further towards a circuit output. The same applies to faults propagating through C3.

Additional rules may apply to fault propagation through fan-out-free regions, i.e., treelike gate structures. For simplicity's sake, it is assumed that cones presented in figures herein are fan-out-free regions. When a fan-out-free region has a single output and is considered blocked, then all faults within that fan-out-free region are unable to propagate to the output (e.g., faults $C_1$ and $C_3$ in FIG. 5). However, as an FFR may feature an output fan-out, fault propagation conditions depend on a combined status of all of its output branches.

Figure 6:
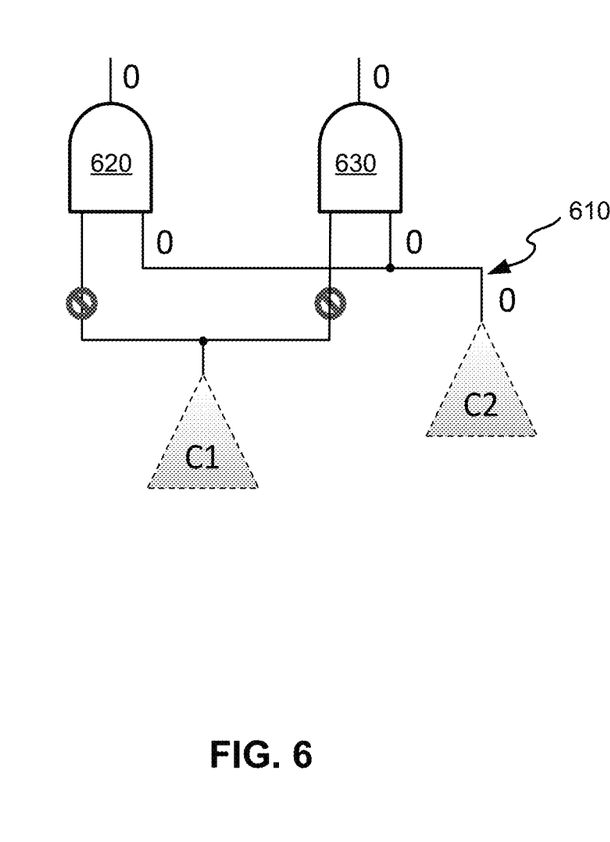
FIG. 6 illustrates another example of a circuit for explaining fault blocking mechanisms.

Consider a circuit shown in FIG. 6. Let output $s_0$ (610) of $C_2$ be set to 0. It results in blocking all fan-out branches of $C_1$ and, therefore, faults $C_1$ cannot propagate to the outputs of the two AND gates 620 and 630. On the other hand, if the same $C_1$ featured additional output branches that do not reach gates 620 and 630 or fan-out-free regions already blocked, then its internal faults would not be blocked due to the existence of alternative propagation routes.

The main concept of a horizontal conflict is illustrated in FIG. 4. A logic value of 1 is necessary to propagate faults through the AND gate 420, whereas a logic value of 0 is needed to achieve the same with the OR gate 440. Hence, if stem $s_0$ (450) is set to 0, then faults $C_1$ (410) are blocked. Similarly, applying 1 to stem $s_0$ (450) blocks faults $C_2$ (420). The degree of a horizontal conflict at a given stem s may be measured by using the following metric:

$$H_s = \min\{u_s, U_s\} \qquad (1)$$

where $u_s$ and $U_s$ are quantities of faults blocked by setting stem s to 0 and 1, respectively. As can be seen, the degree of horizontal conflicts is measured as a minimal number of blocked faults. It relates to a lower bound of conflicts at a given stem or, stated differently, it indicates the amount of faults whose blocking is inevitable.

In the example illustrated in FIG. 4, assume $C_1$ (410) and $C_2$ (420) host $D_{C1}$=4,000 faults and $D_2$=7,000 faults, respectively. The number of blocked faults at the stem is equal to the sum of blocked faults recorded on all fan-out branches. In this case, setting the stem $s_0$ (450) to 0 blocks propagation of faults $C_1$ (410), i.e., $u_s = D_{C1}$. Similarly, setting the stem $C_1$ (410) to 1 blocks propagation of faults $C_2$ (420), i.e., $U_s = D_{C2}$. Finally, $H_s = \min\{u_s, U_s\} = \min\{D_{C1}, D_{C2}\} = D_{C1} = 4,000$, according to Eq. 1. To propagate faults $C_1$ (410) and $C_2$ (420) at the same time, a control point may be deployed at either of the two branches, $s_1$ (460) and $s_2$ (470), as discussed previously.

Figure 7:
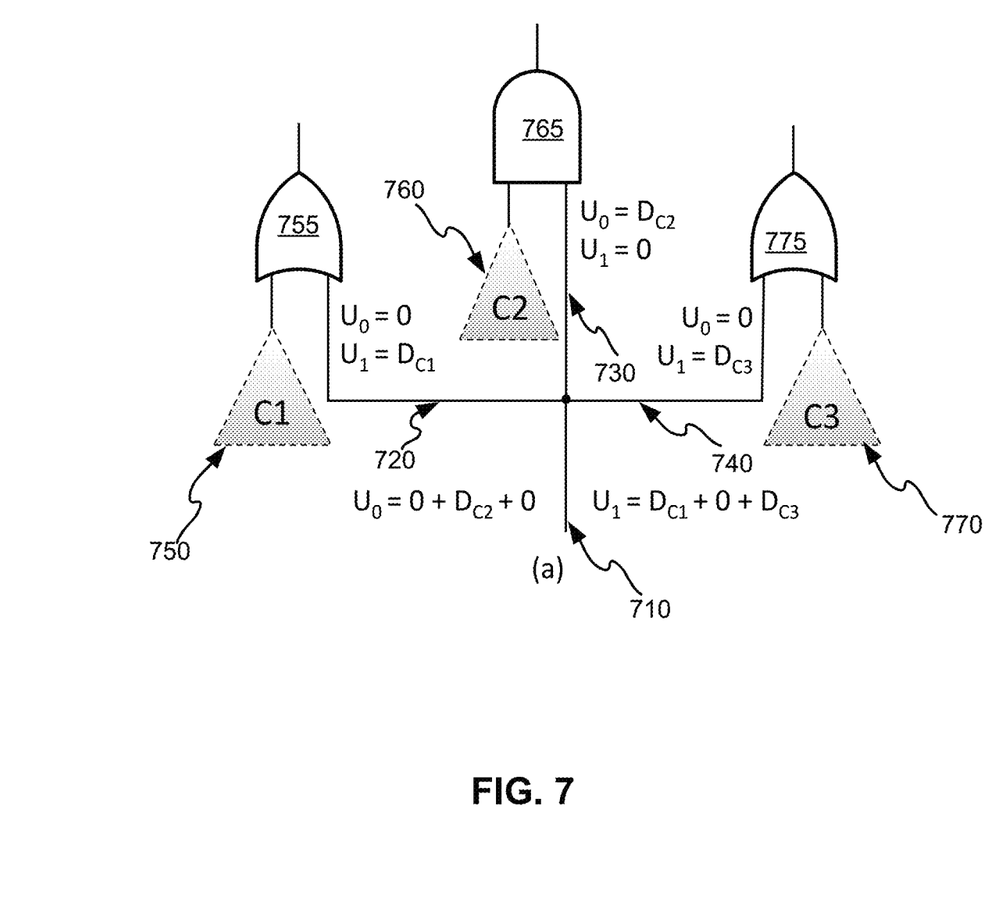
FIG. 7 illustrates an example of horizontal conflicts.

FIG. 7 illustrates a slightly more complicated case of horizontal conflicts. In the figure, a stem 710 features three output branches 720, 730 and 740. Cones $C_1$ (750), $C_2$ (760), and $C_3$ (770) drive the corresponding gates 755, 765 and 775, respectively. Assume that $D_{C1}$=1,000, $D_{C2}$=8,000, and $D_{C3}$=5,000, representing the number of faults hosted by the cones $C_1$ (750), $C_2$ (760), and $C_3$ (770), respectively. Then, for the stem 710, $u_s = D_{C2} = 8,000$ and $U_s = D_{C1} + D_{C3} = 6,000$. Thus, $H_s = U_s = 6,000$. To reduce the conflict, control points may be inserted on some branches. For example, an OR gate may be inserted on the branch 730 and an AND gate may be inserted on the branch 740. As such, $u_s = 0$ and $U_s = 1,000$.

The number of test points is usually limited as the test point insertion introduces area and performance penalty. One solution is to use a threshold denoted as β for blocked faults. Only branches that have the number of blocked faults above the threshold β are considered for the test point insertion. The threshold β may be user-defined and circuit-specific.

The flow chart 800 is used here to illustrate how test points are inserted to reduce horizontal conflicts according to some embodiments of the disclosed technology. In operation 810, the insertion location determination unit 220 computes internal signal conflict metrics such as those for horizontal conflict metrics. In operation 820, the test point insertion unit 240 adds/adjusts test points on locations selected based on the internal signal conflict metrics. For example, appropriate test points are added to branches having the number of blocked faults above β. Or branches having the first n (n>0) largest blocked faults. If none of one or more predetermined termination conditions is met, internal signal conflict metrics are recomputed on the design with the added test points and the process repeats. When the operation 820 is repeated, some of the existing test points may be replaced with new test points.

Another threshold for $H_s$ (denoted as γ) may be introduced to reduce the computation time. Only branches on a stem with $H_s > \gamma$ may be considered for the test point insertion. When the operation 810 is repeated, $H_s$ is also recomputed. One example of a predetermined termination condition is all eligible branches are examined.

It is worth noting that an overall profile of internal signal conflicts keeps changing during test point insertion process. Thus, test points already in may visibly impact further test point insertion decisions.

Conflicts between logic values when running ATPG may also occur in a vertical manner. Four parameters may be employed as the vertical conflict metrics: $b_x$ and $B_x$—the number of 0s and 1s, respectively, required on net x to propagate faults through all relevant gates, and $f_x$ and $F_x$—the number of forward-implied values of 0 and 1, respectively, on net x due to earlier backward justifications.

Figure 9:
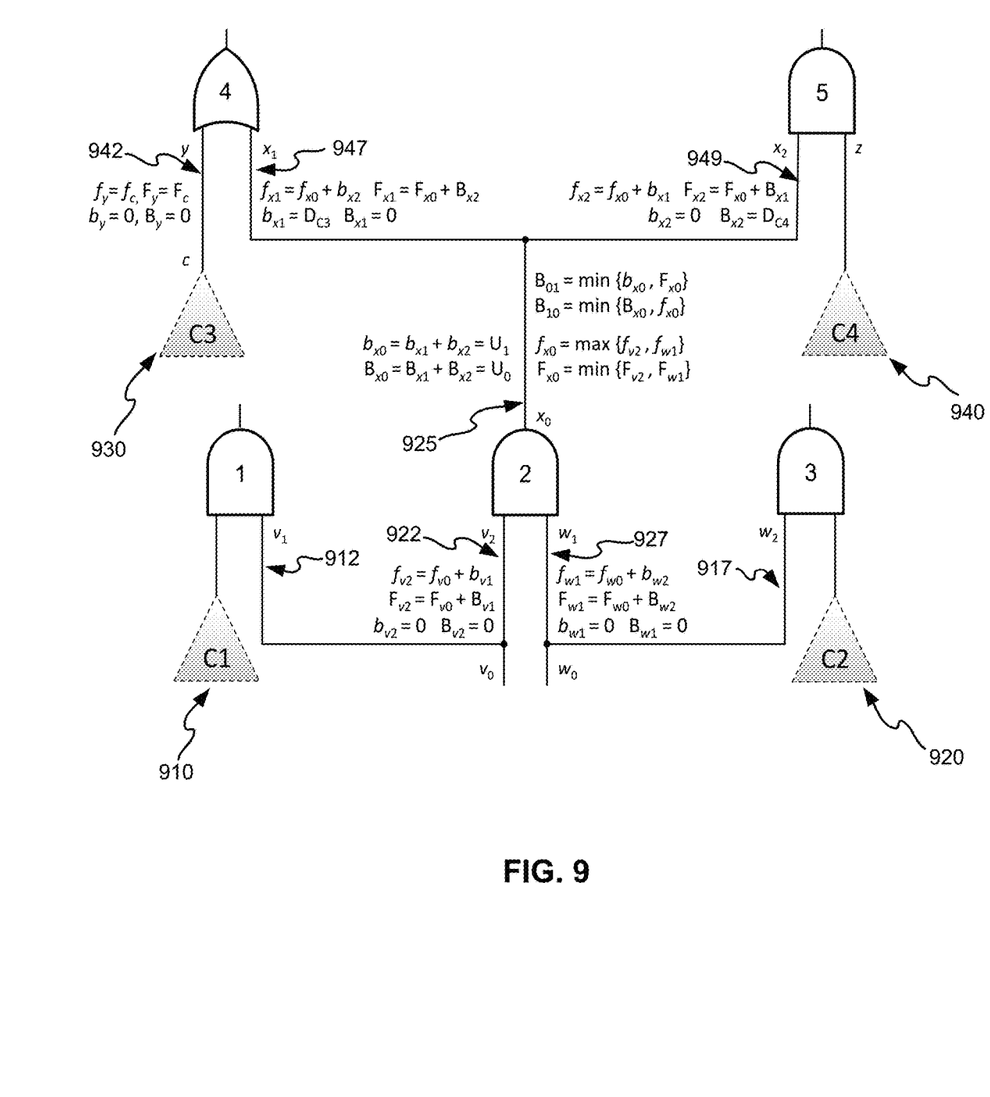
FIG. 9 illustrates an example of vertical conflicts.

FIG. 9 illustrates an example of vertical conflicts. If a gate 2 is set to 0 to enable propagation of faults $C_3$ (930), then at least one of its inputs 922 and 927 needs to be set to 0. This precludes propagation of faults $C_1$ (910), faults $C_2$ (920), or both. Propagation of faults $C_4$ (940) is also not possible. On the other hand, having 1 on the output (925) of the gate 2 (as a result of attempts to propagate faults $C_1$ (910) and faults $C_2$ (920)) blocks faults $C_3$ (930). As can be seen, a "vertical" conflict occurs at the stem between logic values being forward-implied and those resulting from backward justifications that are needed to propagate different groups of faults.

To enable propagation of faults $C_3$ (930), an input $x_1$ (947) of the gate 4 has to be set to 0 at least $D_{C3}$ times, i.e., $b_{x1} = D_{C3}$. As 1 is the controlling value for the OR gate 4, $B_{x1} = 0$ (this value would block any fault propagation). Assume that $b_y = 0$ and $B_y = 0$ for the other input y (942) of the gate 4. This is because faults that may propagate to input $x_1$ (947) of gate (4) may also propagate to input $x_2$ of the gate 5, and thus there are no necessary assignments associated with y (942). However, if the gate 4 featured another input coupled to a fan-out-free region (say $C_5$), then $b_y$ and $B_y$ would assume nonzero values as the gate 4 would be a part of the only propagation path for faults originating in $C_3$.

To determine $b_{x0}$ and $B_{x0}$ for a fan-out stem $x_0$ having fan-out branches $x_1, x_2, \ldots x_n$, the following formulas may be used:

$$b_{x0} = b_{x0} + b_{x2} + \ldots + b_{xn} \quad (2)$$

$$B_{xo} = B_{x1} + B_{x2} + \ldots + B_{xn} \quad (3)$$

The value of $b_x$ ($B_x$) for line x equals the number of blocked faults when x is set to 1 (0). By using this contrapositive rule, one can easily implement a circuit-tracing-based technique to arrive with estimation of $b_x$ and $B_x$. The fan-out stem $x_0$ (925) in the example shown in FIG. 9 has two branches $x_1$ (947) and $x_2$ (949). Accordingly, $b_{x0} = b_{x1} + b_{x2} = U_{x0} = D_{C3} + 0 = D_{C3}$ and $B_{x0} = B_{x1} + B_{x2} = u_{x0} = 0 + D_{C4} = D_{C4}$ (see FIG. 9).

The vertical conflict analysis may also involve information regarding the numbers $f_x$ and $F_x$ of 0s and 1s occurring at a given line x as a result of the justification of other gates. For a fan-out branch $x_k$, the number $f_{xk}$ of 0s is a sum of $f_{x0}$ (the number of 0s implied on stem $x_0$) and the number of 0s required by the remaining branches of the same stem in order to propagate faults, i.e., $$f_{xk} = f_{x0} + \Sigma b_{xi} \quad i \neq k \quad (4)$$

Similarly, one can determine $F_{xk}$. As an example, consider computation of and $F_{x1}$ for the gate 4 in FIG. 9. The number of 0s reaching its input $x_1$ (947), $f_{x1}$, is equal to the number of forward implied 0s on stem $x_0$ (925), $f_{x0}$, plus the number $b_{x2}$ of 0s required at input $x_2$ (949) of the gate 5 to propagate faults C4 (940). As can be seen in the figure, $b_{x2} = 0$ since 0 is a controlling value for an AND gate. As a result, $f_{x1} = f_{x0}$. On the other hand, the number of 1s ($F_{x1}$) equals the number of 1s at $x_0$ (925), $F_{x0}$, plus 1s needed to propagate faults C4 (940), $B_{x2}$. Thus, $F_{x1} = F_{x0} + B_{x2}$.

In addition to fan-out branches, values off and F for outputs of different types of gates need to be determined. Consider the gate 2 in FIG. 9. Let inputs $v_0$ (922) and $w_0$ (927) be primary ones. Inputs $v_1$ (912) and $w_2$ (917) (and hence $v_2$ (922) and $w_1$ (927)) have to be set to 1 in order to propagate faults C1 (910) and C2 (920) at least $D_{C1}$ and $D_{C2}$ times, respectively. However, to determine the total number of 0s and 1s seen at the inputs of gate (2), one should take into account 0s and 1s implied forward through stems $v_0$ and $w_0$. Since they are primary inputs, $f_{v0}$, $F_{v0}$, $f_{w0}$, and $F_{w0}$ are all equal to 0. Thus $F_{v2} = D_{C1}$ and $F_{w1} = D_{C2}$. Moreover, $f_{v2}$ and $f_{w1}$ are both 0, as 0 is a controlling value for the gates 1 and 3. The number $F_{x0}$ of forward implied 1s through the gate 2 is a function of $F_{v2}$ and $F_{w1}$. The value of $F_{x0}$ may be defined as the minimum of the numbers of 1s at the inputs of the gate 2. On the other hand, as 0 is a controlling value for the AND gate, the number $f_{x0}$ of 0s propagated through the gate 2 can be expressed as the maximum of the numbers of 0s at its inputs ($f_{v2}$ and $f_{w1}$). In this particular case, a value of $f_{x0}$ is 0 because neither the gate 1 nor the gate 3 requires 0 to propagate faults C1 or C2.

The values of $f_{x0}$ and $F_{x0}$ are obtained by structural analysis of a circuit net list in conjunction with its fault list to find faults that would otherwise be blocked, if 1 and 0 are applied, respectively, to a gate input. Given the numbers $f_k$ and $F_k$ of required 0s and 1s on a gate k-th input, the corresponding output metrics $f_s$ and $F_s$ may be computed by using the following formulas:

$$f_s = f_k f_s = F_k \quad (5a)$$

$$F_s = F_k F_s = f_k \quad (5b)$$

$$f_s = \max\{f_k\} \, f_s = \min\{F_k\} \quad (6a)$$

$$F_s = \min\{F_k\} \, F_s = \max\{f_k\} \quad (6b)$$

$$f_s = \min\{f_k\} \, f_s = \max\{F_k\} \quad (7a)$$

$$F_s = \max\{F_k\} \, F_s = \min\{f_k\} \quad (7b)$$

$$f_s = (\min\{f_a, f_b\} + \min\{F_a, F_b\})/2$$

$$F_s = (\min\{f_a, F_b\} + \min\{F_a, f_b\})/2 \quad (8)$$

The above equations correspond to logic gates as follows: buffer (5a), inverter (5b), AND (6a), NAND (6b), OR (7a), NOR (7b), and 2-input XOR (8). One can arrive with formulas for other (complex) gates in a similar manner.

Having defined the basic metrics, a measure of a vertical conflict at stem s may be derived. In this particular case, one can be interested in estimation of a lower bound of conflicts between values $b_s$, $F_s$ and $f_s$, $B_s$. The degree of a vertical conflict at a given stem s may be measured by using the following equation:

$$V_s = \max\{\min\{b_s, F_s\}, \min\{B_s, f_s\}\} \quad (9)$$

As can be seen, Eq. 9 estimates the amount of inconsistency between signals required due to fault propagation conditions and logic values being forward implied by such decisions. Inserting a test point at a stem can alleviate this type of conflicts. A type of control point is selected in such a way that if $V_s = \min\{b_s, F_s\}$, then an AND control point may be used. Otherwise, that is, $V_s = \min\{B_s, f_s\}$, an OR control point may be inserted.

Similar to reducing horizontal conflicts discussed previously, the process shown by the flow chart 800 may be employed to insert test points for reducing vertical conflicts. Horizontal and vertical conflicts may be analyzed and processed at the same time or in sequence.

Conclusion

While the disclosed techniques has been described with respect to specific examples including presently preferred modes of carrying out the disclosed techniques, those skilled in the art will appreciate that there are numerous variations and permutations of the above described systems and techniques that fall within the spirit and scope of the disclosed techniques as set forth in the appended claims. For example, while specific terminology has been employed above to refer to electronic design automation processes, it should be appreciated that various examples of the disclosed techniques may be implemented using any desired combination of electronic design automation processes.

What is claimed is:

1. A method for reducing test pattern counts, executed by at least one processor of a computer, comprising:
   determining, by the at least one processor of the computer, locations in a circuit design for inserting test points based on internal signal conflicts caused by detecting multiple faults with a single test pattern, wherein the internal signal conflicts are incompatibilities on internal lines due to fault excitation, backward justification, or fault propagation of the multiple faults, and the internal signal conflicts comprise at least one horizontal conflict, wherein the horizontal conflict of a branch of a net in the circuit design is measured based on numbers of faults being blocked by setting the branch to a signal of "0" and of "1", respectively; and
   modifying, by the at least one processor of the computer, the circuit design by inserting test points at the locations.

2. The method recited in claim 1, wherein the test points are control points.

3. The method recited in claim 1, wherein the internal signal conflicts comprise vertical conflicts.

4. The method recited in claim 3, wherein the vertical conflict of a stem of a net is measured based on numbers of conflicts due to fault propagation conditions and logic values being forward-implied by the conditions.

5. The method of claim 1, wherein the determined locations are on branches of the circuit design having a number of block faults exceeding a threshold.

6. A method for reducing test pattern counts, executed by at least one processor of a computer, comprising:
   computing, by the at least one processor of the computer, internal signal conflict metrics for a circuit design;
   by the at least one processor of the computer, for locations of the circuit design selected based on the internal signal conflict metrics, adding test points to the locations or adjusting test points at the locations; and
   repeating the computing and the adding/adjusting until one of one or more predetermined conditions is met;
   wherein the internal signal conflict metrics comprise metrics pertaining to horizontal signal conflicts and, for a given one of the horizontal signal conflicts on a branch of a net of the circuit design, the metric for the given horizontal signal conflict is based on numbers of faults being blocked by setting the branch to a signal of "0" and of "1", respectively.

7. The method recited in claim 6, wherein the test points are control points.

8. The method recited in claim 6, wherein the internal signal conflicts comprise vertical conflicts.

9. The method recited in claim 8, wherein the vertical conflict of a stem of a net is measured based on numbers of conflicts due to fault propagation conditions and logic values being forward-implied by the conditions.

10. The method of claim 6, wherein the adding or adjusting test points comprises replacing an existing test point with a new test point.

11. The method of claim 6, wherein the predetermined conditions comprise a condition that all eligible branches of the circuit design have been examined.

12. One or more non-transitory computer-readable media storing computer-executable instructions for causing one or more processors to perform a method for reducing test pattern counts, the method comprising:
   determining locations in a circuit design for inserting test points based on internal signal conflicts caused by detecting multiple faults with a single test pattern, wherein the internal signal conflicts are incompatibilities on internal lines due to fault excitation, backward justification, or fault propagation of the multiple faults, and the internal signal conflicts comprise at least one horizontal conflict, wherein the horizontal conflict of a branch of a net in the circuit design is measured based on numbers of faults being blocked by setting the branch to a signal of "0" and of "1", respectively;
   modifying the circuit design by inserting test points at the locations.

13. The one or more non-transitory computer-readable media recited in claim 12, wherein the internal signal conflicts comprise vertical conflicts.

14. The one or more non-transitory computer-readable media recited in claim 13, wherein the vertical conflict of a stem of a net is measured based on numbers of conflicts due to fault propagation conditions and logic values being forward-implied by the conditions.

15. The one or more non-transitory computer-readable media recited in claim 12, wherein the test points are control points.

16. The one or more non-transitory computer-readable media recited in claim 12, wherein the test points comprise one or more control points.

17. The one or more non-transitory computer-readable media of claim 12,
   wherein the determining locations comprises analysis and processing of both the at least one horizontal conflict and vertical conflicts of the internal signal conflicts.

18. One or more non-transitory computer-readable media storing computer-executable instructions for causing one or more processors to perform a method for reducing test pattern counts, the method comprising:

computing internal signal conflict metrics for a circuit design;
selecting locations of the circuit design based on the internal signal conflict metrics;
adding test points to the locations or adjusting test points at the locations; and
repeating the computing, the selecting, and the adding/adjusting until one of one or more predetermined conditions is met;
wherein the internal signal conflict metrics comprise metrics pertaining to vertical signal conflicts, and the metric for a corresponding one of the vertical signal conflicts is based on numbers of conflicts due to fault propagation conditions and of logic values being forward-implied by the conditions.

19. The one or more non-transitory computer-readable media recited in claim 18, wherein the internal signal conflicts comprise horizontal conflicts.

20. The one or more non-transitory computer-readable media recited in claim 19, wherein the horizontal conflict of a branch of a net in the circuit design is measured based on numbers of faults being blocked by setting the branch to a signal of "0" and of "1", respectively.

21. The one or more non-transitory computer-readable media recited in claim 18, wherein the adding or adjusting test points comprises replacing an existing test point with a new test point.

22. The one or more non-transitory computer-readable media recited in claim 18, wherein the added or adjusted test points comprise one or more control points.

23. The one or more non-transitory computer-readable media recited in claim 18, wherein the predetermined conditions comprise a condition that all eligible branches of the circuit design have been examined.

24. The one or more non-transitory computer-readable media recited in claim 18, wherein the selecting locations comprises analysis and processing of both the vertical signal conflict and horizontal conflicts of the internal signal conflicts.

* * * * *